(12) United States Patent
Uchida et al.

(10) Patent No.: US 8,252,408 B2
(45) Date of Patent: Aug. 28, 2012

(54) ELECTRONIC DEVICE AND METHOD OF MANUFACTURING THE ELECTRONIC DEVICE

(75) Inventors: Kenji Uchida, Kawasaki (JP); Koki Hirasawa, Kawasaki (JP)

(73) Assignee: Renesas Electronics Corporation, Kawasaki (JP)

( * ) Notice: Subject to any disclaimer, the term of this patent is extended or adjusted under 35 U.S.C. 154(b) by 525 days.

(21) Appl. No.: 12/437,940

(22) Filed: May 8, 2009

(65) Prior Publication Data

US 2009/0311485 A1  Dec. 17, 2009

(51) Int. Cl.
  *B32B 3/00* (2006.01)
(52) U.S. Cl. ........ 428/203; 428/172; 428/339; 428/413; 428/500; 257/100
(58) Field of Classification Search .................. 428/172; 257/99–100, 678
See application file for complete search history.

(56) References Cited

U.S. PATENT DOCUMENTS 7,183,589 B2 * 2/2007 Kameyama et al. .......... 257/100

FOREIGN PATENT DOCUMENTS

| CN | 1439175 A | 8/2003 |
|---|---|---|
| CN | 1532938 A | 9/2004 |
| JP | 62-257757 A | 11/1987 |
| JP | 3-11757 A | 1/1991 |
| JP | 2000-173947 A | 6/2000 |
| JP | 2003-133500 A | 5/2003 |

OTHER PUBLICATIONS

Second Office Action issued Jun. 2, 2011, in counterpart Chinese Application No. 200910142612.3.

* cited by examiner

*Primary Examiner* — Bruce H Hess
*Assistant Examiner* — Christopher Polley
(74) *Attorney, Agent, or Firm* — Sughrue Mion, PLLC

(57) ABSTRACT

An electronic device capable of balancing both light transmitting and receiving performance and mounting reliability is provided. The electronic device includes an element (light receiving element), a transparent layer, and a sealing resin layer. The element is, for example, a semiconductor element and has an optically functional region having an optical function (for example, light receiving or light emission) on one face. The transparent layer is located on the optically functional region, directly comes in contact with the one face of the light receiving element, and is optically transparent. The sealing resin layer seals sides of the transparent layer and one face of the light receiving element, does not coat an upper face of the transparent layer, and is mixed with filler that improves rigidity.

5 Claims, 5 Drawing Sheets

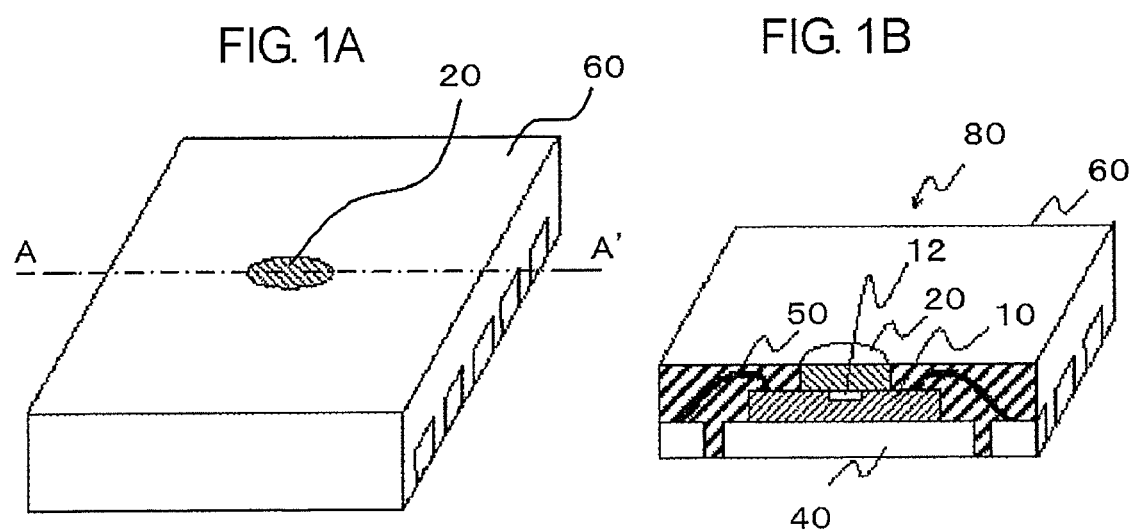

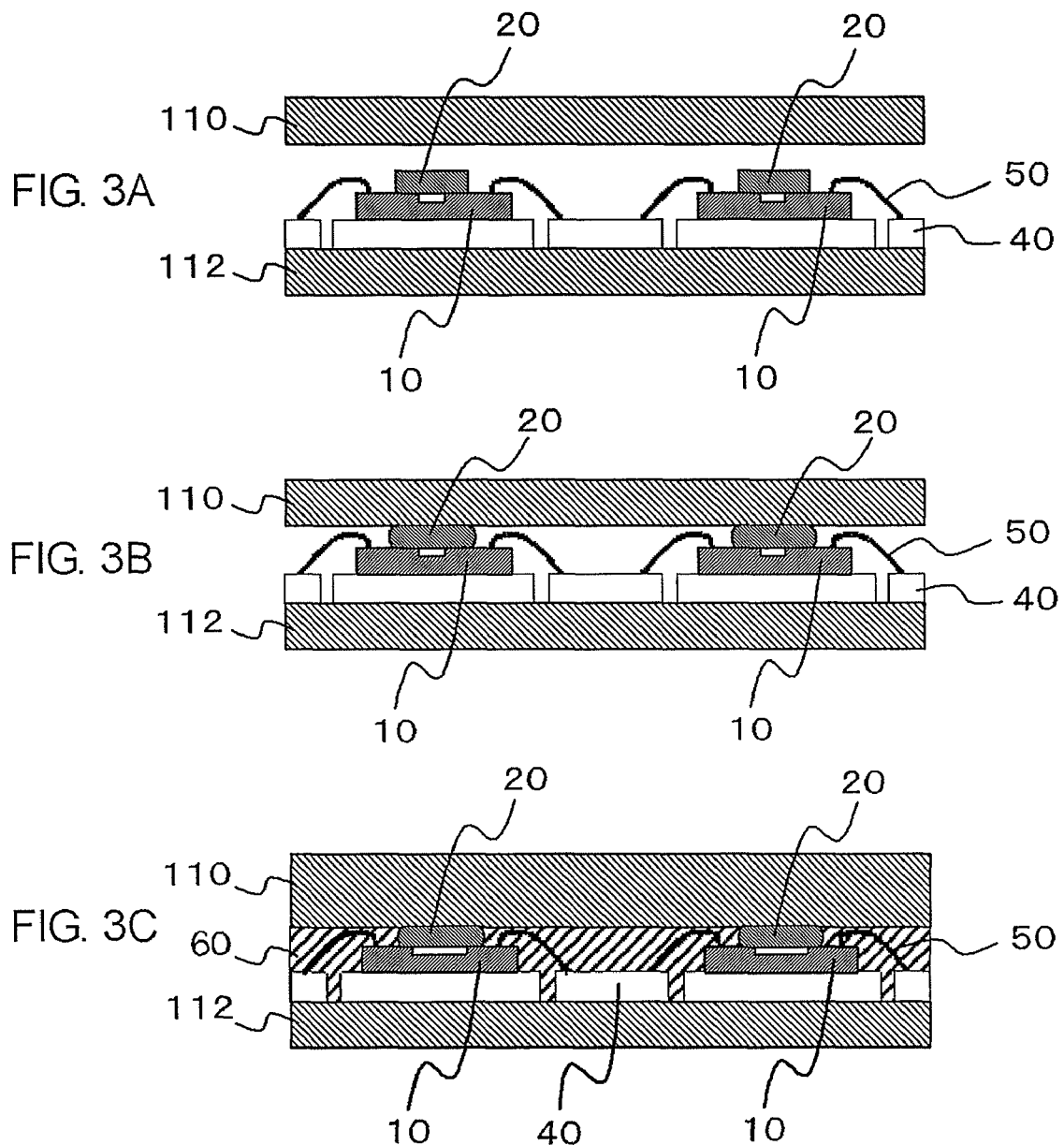

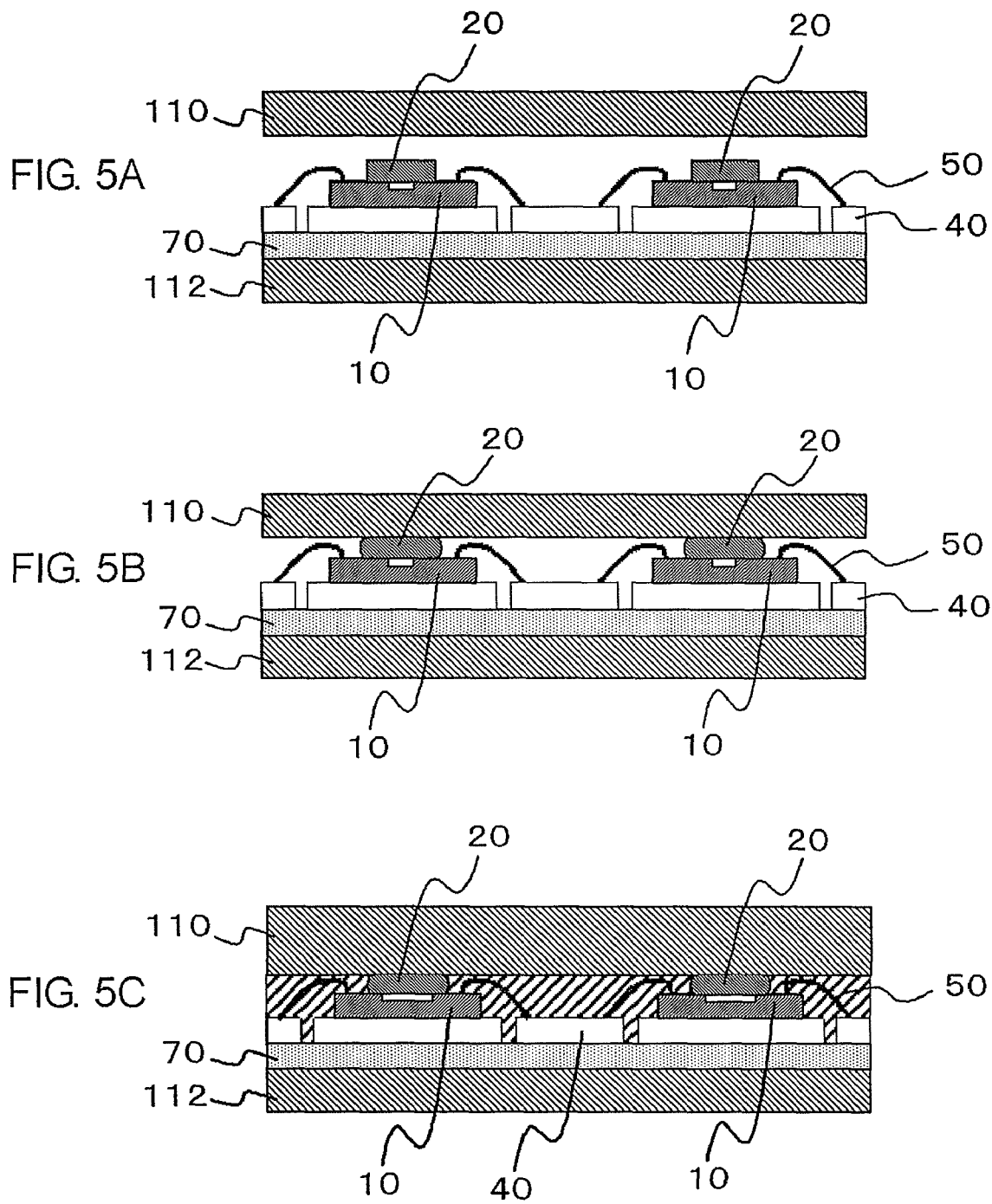

ELECTRONIC DEVICE AND METHOD OF MANUFACTURING THE ELECTRONIC DEVICE

This application is based on Japanese patent application No. 2008-153783, the content of which is incorporated hereinto by reference.

BACKGROUND

1. Technical Field

The present invention relates to an electronic device and a method of manufacturing the same, in which light transmitting and receiving performance is high and mounting reliability is improved.

2. Related Art

Light receiving devices, for example, semiconductor devices for digital versatile discs (referred to as DVD) and electronic devices for use in imaging devices for digital cameras, have a structure in which an element, for example, a semiconductor element is coated with transparent sealing resin so as to introduce an optical signal and transmit the optical signal to a semiconductor and to protect the element from outside influences.

With developments in technologies in recent years, in the case of using typical sealing resin capable of mixing reinforcement substances such as glass filler, for example, as disclosed in FIG. 2 of Japanese Patent Application Laid-Open (JP-A) No. 2003-133500, there has been adopted a method in which semiconductor elements are arranged in a matrix shape on a substrate and the whole aggregate of the semiconductor elements are coated with sealing resin. The reason why such method has been applicable is that reinforcement substances such as glass filler are mixed with the sealing resin and rigidity of the sealing resin is improved, and hardening contraction and thermal contraction of the sealing resin are suppressed; as a result, substrate warpage is reduced and it becomes possible to coat the sealing resin in a large area. A semiconductor device which adopts the method has a structure in which a periphery of semiconductor elements arranged on a lead frame is coated with sealing resin mixed with glass filler, and the lead frame and the sealing resin are cut into predetermined sizes.

Also in a semiconductor device which treats an optical signal, for example, as disclosed in FIG. 1 of JP-A No. 03-11757 and FIG. 1 of JP-A No. 62-257757, there is a structure in which a light transmission member is fixed on a functional unit of a semiconductor element by transparent adhesive, and the periphery of the semiconductor element and the light transmission member is coated with sealing resin.

In addition, in an example shown in FIG. 1 of JP-A No. 2000-173947, there is adopted a structure in which expensive glass lenses are directly jointed on functional units of a semiconductor element by anode junction, respectively; and the periphery of the semiconductor element and the mounted glass lenses is coated with sealing resin.

SUMMARY

However, in the case where an electronic device which treats light is manufactured using the above technology, there are some problems.

As a first problem, in the structure and the construction method of the electronic device which treats light, there is a case where defects such as a crack is generated in an element at a time of a reflow process in the case of mounting the element on a mounting substrate. This is caused by the fact that glass filler or the like cannot be mixed with transparent sealing resin. The reason is that, when reinforcement substances such as the glass filler are mixed with the transparent sealing resin, an optical signal is reflected and scattered by difference of refractive index between the sealing resin and the filler and an optical signal attenuates. Therefore, light transmitting and receiving performance is degraded. Consequently, when an electronic device which uses transparent sealing resin is situated in an environment in which the temperature increases rapidly, such as a reflow process, there is a case where moisture entered in the electronic device during storing of a semiconductor device due to a shortage in rigidity of the transparent sealing resin becomes vapor, and explodes.

A second problem is that, in the case where the method disclosed in JP-A No. 2003-133500 is applied to an electronic device which treats an optical signal, a substrate is warped by hardening contraction and a change in temperature of transparent sealing resin arranged on one side of the substrate. This is caused by the fact that glass filler or the like cannot be mixed with the transparent sealing resin, as in the first problem. The reason is that, if the glass filler or the like is not mixed, the hardening contraction at a time of forming of the sealing resin is not suppressed, and thermal contraction of the resin is not suppressed in the case of cooling from a forming temperature to the room temperature; and therefore, the substrate is warped by the hardening contraction and the thermal contraction of the transparent resin.

A third problem is that, in the structure disclosed in JP-A No. 03-11757 and JP-A No. 62-257757, the light transmission member is adhesive-fixed to the functional unit by a transparent resin layer; and therefore, an interface between the transparent resin layer and the light transmission member appears and optical refraction is generated by the interface. In addition, respective light transmission rates are not completely equal and light attenuation appears to cause degradation of light transmitting and receiving performance.

As described above, in the above mentioned technology, it is difficult to balance both light transmitting and receiving performance and mounting reliability.

In one embodiment, there is provided an electronic device, including:

an element which has an optically functional region having an optical function on one face;

a transparent layer which is located on the optically functional region, directly comes in contact with the one face, and is optically transparent and a resin layer; and a sealing resin layer which seals the one face and sides of the transparent layer, does not coat an upper face of the transparent layer, and is mixed with filler that improves rigidity;

wherein the upper face of the transparent layer and the upper face of the sealing resin layer are exposed on a surface of the electronic device.

According to the present invention, the transparent layer which is optically transparent is located on the optically functional region. The transparent layer directly comes in contact with one face; and therefore, attenuation of light is suppressed as compared to the case having an adhesive layer. In addition, the sealing resin layer which seals the sides of the transparent layer and the one face are mixed with the filler, and therefore, mounting reliability is improved. Accordingly, it is possible to balance both light transmitting and receiving performance and mounting reliability.

In another embodiment, there is provided a method of manufacturing an electronic device, including:

directly providing an optically transparent resin film on one face of an element which has an optically functional region having an optical function on the one face;

forming a transparent layer which is located on the optically functional region by selectively removing the resin film; and forming a sealing resin layer which seals sides of the transparent layer and the one face, does not coat an upper face of the transparent layer, and is mixed with filler that improves rigidity.

According to the present invention, it is possible to balance both light transmitting and receiving performance and mounting reliability of an electronic device.

BRIEF DESCRIPTION OF THE DRAWINGS

The above and other objects, advantages and features of the present invention will become apparent from the following description of certain embodiments taken in conjunction with the accompanying drawings, in which:

FIG. 1A is a perspective view showing an electronic device in a first embodiment and FIG. 1B is a cross-sectional view taken along the line A-A' of the electronic device of FIG. 1A;

FIGS. 3A to 3C are views each showing in detail a process of FIG. 2G;

FIGS. 5A to 5C are cross-sectional views each showing a method of manufacturing an electronic device in a third embodiment.

DETAILED DESCRIPTION

Figure 2A:
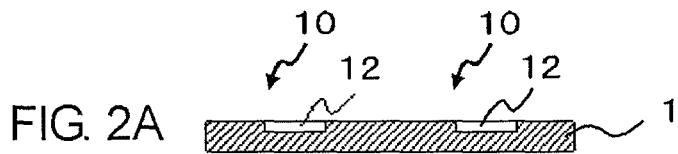
FIGS. 2A to 2H are cross-sectional views each showing a method of manufacturing the electronic device.

The invention will be now described herein with reference to illustrative embodiments. Those skilled in the art will recognize that many alternative embodiments can be accomplished using the teachings of the present invention and that the invention is not limited to the embodiments illustrated explanatory purposed.

Hereinafter, embodiments of the present invention will be described with reference to drawings. Note that the same reference numerals are given to those similar to constituent elements in all the drawings and their detail description will not be repeated.

FIG. 1A is a perspective view showing an electronic device 80 in a first embodiment and FIG. 1B is a cross-sectional view taken along the line A-A' of the electronic device of FIG. 1A. As shown in these drawings, the electronic device 80 includes an element (light receiving element) 10, a transparent layer 20 that is a resin layer, and a sealing resin layer 60. The element 10 is, for example, a semiconductor element and has an optically functional region 12 having an optical function (for example, light receiving or light emission) on one face. The transparent layer 20 is located on the optically functional region 12, directly comes in contact with the one face of the light receiving element 10, and is optically transparent. The sealing resin layer 60 seals sides of the transparent layer 20 and the one face of the light receiving element 10, does not coat an upper face of the transparent layer 20, and is mixed with filler that improves rigidity. The electronic device 80 mentioned in the present embodiment is one in which one or both of a passive element and an active element are formed on a surface of a semiconductor substrate and a glass substrate.

In addition, the light receiving element 10 of the electronic device 80 is mounted on a lead frame 40 and electrically connected to the lead frame 40 via thin metallic wires 50. The lead frame 40 and the thin metallic wires 50 are also sealed with a sealing resin layer 60.

An upper face of the transparent layer 20 and an upper face of the sealing resin layer 60 are exposed to a surface of the electronic device 80. The upper face of the transparent layer 20 is higher than the upper face of the sealing resin layer 60 and is protruded upward. The reason is that the configuration prevents the sealing resin layer 60 from flowing onto the surface of the transparent layer 20 even taking account of variation in height of the transparent layer 20. Its detail will be described later.

In a manufacturing step of the electronic device 80 to be described in detail later, the variation in height of the transparent layer 20 is about 10 micrometers by standard deviation. The variation in height of the transparent layer 20 is a possible difference in height of the transparent layer 20 in a formation step of the transparent layer 20, such as a change in the amount of light during exposure, a change in developing solution and processing time during processing procedure, and the like in the case where a resin film 22 (to be described later) having a uniform thickness is formed using a photolithography method. If the height of the transparent layer 20 is not higher than that of the sealing resin layer 60 even in the case of the lowest, taking account into variation is such a manufacturing step; there is a possibility that sealing resin constituting the sealing resin layer 60 is entered between the transparent layer 20 and a sealing die (to be described later), and accordingly the surface of the transparent layer 20 is contaminated.

On the other hand, in the electronic device of the present embodiment, the upper face of the transparent layer 20 is higher than the upper face of the sealing resin layer 60 by equal to or more than 10 μm and equal to or less than 60 μm. Such a height of the transparent layer 20 is obtained by designing the transparent layer 20 so as to be higher than the upper face of the sealing resin layer 60 by about 30 micrometers that is a value three times as large as the standard deviation of variation in height of the transparent layer 20. In addition, the design of such a height of the transparent layer 20 can be appropriately set by, for example, adjusting pressure at which the transparent layer 20 is pressed in a sealing step (to be described later).

Incidentally, in the sealing step, if the sealing resin constituting the sealing resin layer 60 does not flow into the surface of the transparent layer 20 and does not contaminate the transparent layer 20, the upper face of the transparent layer 20 may be the same plane as the upper face of the sealing resin layer 60.

It is preferable that the height of the transparent layer 20 is equal to or more than 0.05 mm, and preferably equal to or more than 0.1 mm. This can prevent the thin metallic wires 50, which are connected to the lead frame 40 from predetermined positions of the light receiving element 10, from coming into contact with sealing dies 110 and 112 (to be described later) for use in a manufacturing process of the electronic device 80. Therefore, the upper face of the transparent layer 20 can be firmly brought into contact with the sealing die 110; and accordingly, it is possible to prevent the sealing resin layer 60 from entering into the surface of the transparent layer 20. In this case, the height of the transparent layer 20 is a length in a vertical direction from the upper face of the light receiving element 10 to the upper face of the transparent layer 20, and equal to the thickness of the resin film serving as the transparent layer 20.

The transparent layer 20 is, for example, one in which resin is hardened by light or heat. The resin has adhesiveness in a state before hardening, and can be directly adhered to the surface of the light receiving element 10. As a specific example of the resin, there is resin including optical setting resin such as acrylic group resin and thermo setting resin such as epoxy resin.

It is preferable that a coefficient of elasticity of the transparent layer 20 is equal to or more than 1 GPa and equal to or less than 6 GPa at 20° C., and equal to or more than 10 MPa and equal to or less than 3 GPa at 200° C. A function which protects the optically functional region 12 of the electronic device 80 can be obtained with the coefficient of elasticity equal to or more than 1 GPa and equal to or less than 6 GPa at 20° C. In addition, with the coefficient of elasticity equal to or more than 10 MPa and equal to or less than 3 GPa at 200° C., the transparent layer 20 slightly elastically deforms and functions as a cushioning material during press-contacting by the sealing dies 110 and 112 in the manufacturing process of the electronic device 80; and therefore, it is possible to protect the optically functional region 12 from pressure. In this case, the coefficient of elasticity of the transparent layer 20 is a coefficient of elasticity in a state where the transparent layer 20 is completely hardened by light or heat.

The sealing resin constituting the sealing resin layer 60 is sealing resin for use in sealing of the electronic device 80. The filler to be mixed with the sealing resin is filler having higher rigidity than the sealing resin itself, for example, glass filler.

FIGS. 2A to 2H are cross-sectional views each showing a method of manufacturing an electronic device 80. First, as shown in FIG. 2A, a wafer 1 formed with a plurality of light receiving elements 10 is prepared. An optically functional region 12 is exposed on each surface (one face) of the light receiving element 10 arranged in the wafer 1. Note that, in FIG. 2A, only two of the plurality of the light receiving elements 10 arranged in the wafer 1 are shown.

Figure 2B:
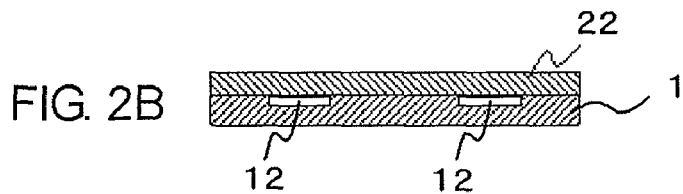

Next, as shown in FIG. 2B, an optically transparent resin film 22 is directly provided on the wafer 1. In this case, the resin film 22 is one resin film having a uniform thickness. The resin film 22 is resin including optical setting resin such as acrylic group resin or thermo setting resin such as epoxy resin. Then, the resin film 22 is in a state before hardening in a state where the resin film 22 is to be provided on the wafer 1. Therefore, the resin film 22 has adhesiveness and is directly arranged on the wafer 1 using the adhesiveness.

Incidentally, the reason for using the film-shaped resin film 22 is to form a resin film having a thickness of uniform and equal to or more than 0.05 mm on the whole surface of the wafer 1. That is, in the case where liquid resin is used as the resin film 22, low viscosity resin is used in order to form the resin film 22 having a uniform film thickness on the whole surface of the wafer 1; and therefore, it is difficult to obtain a thickness equal to or more than 0.05 mm due to low viscosity thereof. On the other hand, when it is tried to form a film thickness equal to or more than 0.05 mm on the whole of the wafer using liquid resin, high viscosity resin is used; and therefore, viscous resistance becomes high at a time applying on the wafer due to high viscosity thereof, variation in height becomes large, and it is difficult to obtain a uniform film. In contrast, it is possible to realize the resin film 22 having a uniform film thickness equal to or more than 0.05 mm by using the film-shaped resin film 22. In the present embodiment, the whole surface of the wafer 1 is coated with the resin film 22. The thickness of the resin film 22 is, for example, 0.12 mm. In this manner, the transparent layer 20 having a height of, for example, 0.12 mm can be obtained.

Note that there is shown the example in which the thickness of the resin film 22 is 0.12 mm; however, the thickness of the resin film 22 can be appropriately adjusted. In the case where the height of the transparent layer 20 is equal to or more than 0.12 mm, the thickness of the resin film 22 may be further increased.

Figure 2C:
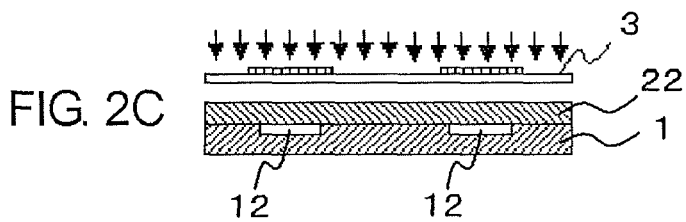

Next, as shown in FIG. 2C, patterning of the resin film 22 is performed so as to form the transparent layer 20 by positioning a mask for exposure 3 and performing exposure.

Figure 2D:
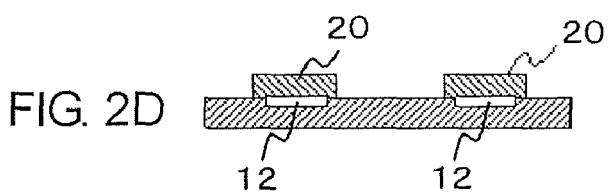

After that, as shown in FIG. 2D, processing procedure is performed and the resin film 22 other than the transparent layer 20 is removed. In this manner, the transparent layer 20 is formed on each of a plurality of the optically functional regions 12. As described above, the transparent layer 20 can be formed using a photolithography method.

Incidentally, at a time after the processing procedure, the transparent layer 20 is not completely hardened; and therefore, the transparent layer 20 and the wafer 1, that is, the transparent layer 20 and the light receiving element 10 are adhered by poor junction force, but are not adhered firmly.

Next, heat treatment or light irradiation is performed to the wafer 1 on which the transparent layer 20 is formed to completely harden the transparent layer 20, so that the transparent layer 20 and the wafer 1, that is, the transparent layer 20 and the light receiving element 10 are firmly glued. There is no shape variation of the transparent layer 20 due to the heat treatment or the light irradiation. Incidentally, the transparent layer 20 is formed, for example, in a columnar shape; however, it is possible to form the transparent layer 20 in an elliptic columnar shape, a quadrangular prism, in accordance with the shape of the optically functional region 12.

Note that, the coefficient of elasticity of the transparent layer 20 is adjusted to, for example, approximately 2.4 GPa at the room temperature and approximately 15 MPa at 200° C. The coefficient of elasticity of the transparent layer 20 can be appropriately adjusted by a change in kinds of resin capable of hardening by light or heat and a change in composition ratio of inclusion such as hardener, or manufacturing conditions such as the amount of hardening light and hardening temperature.

Figure 2E:
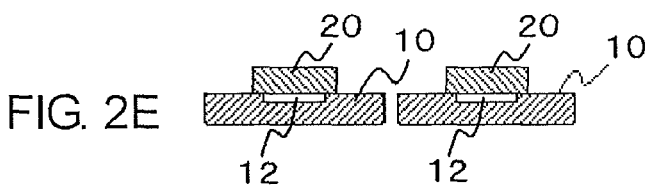

After that, as shown in FIG. 2E, an individual light receiving element 10 is cut away from the wafer 1 and the light receiving element 10 having the transparent layer 20 is obtained.

Figure 2F:
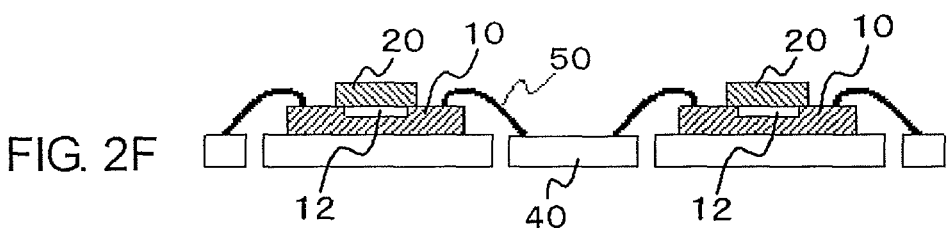

Next, as shown in FIG. 2F, the light receiving element 10 is adhered to a predetermined position on the lead frame (wiring substrate) 40 through adhesive (not shown). Subsequently, terminals of the light receiving element 10 (not shown) and terminals of the lead frame 40 (not shown) are electrically connected with each other by thin metallic wires 50. Incidentally, a plurality of light receiving elements 10 are arranged on the lead frame 40 while maintaining predetermined distances.

Figure 2G:
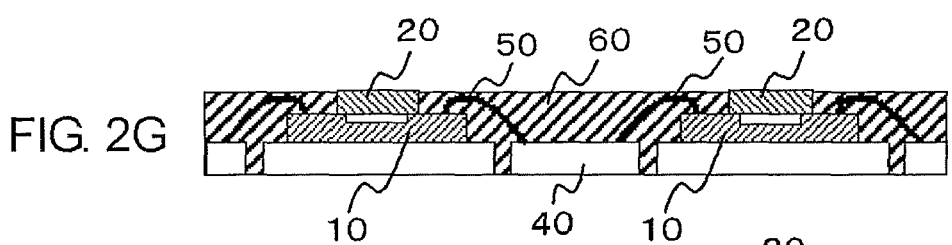

After that, as shown in FIG. 2G, sides of the transparent layer 20, one face of the light receiving element 10, the thin metallic wires 50, and the whole of the lead frame 40 are coated with a sealing resin layer 60.

Figure 2H:
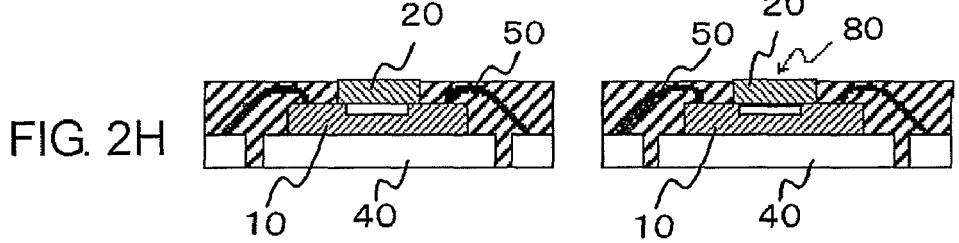

Subsequently, as shown in FIG. 2H, the lead frame 40 is divided for each light receiving element 10. In this manner, the electronic device 80 having a desired shape can be obtained.

FIGS. 3A to 3C are views each showing in detail a process shown of FIG. 2G. First, as shown in FIG. 3A, sealing dies 110 and 112 whose forming faces are flat faces are prepared; and the light receiving elements 10 on the lead frame 40 shown in FIG. 2F are fixed at predetermined positions between the sealing dies 110 and 112.

Next, as shown in FIG. 3B, the forming face of the sealing die 110 (upper die) is press-contacted to the upper faces of the transparent layers 20 and the forming face of the sealing die 112 (lower die) is press-contacted to the lower face of the lead frame 40, respectively. That is, clearance between the upper faces of the transparent layers 20 and the forming face of the sealing die 110 and clearance between the lower face of the lead frame 40 and the forming face of the sealing die 112 are minimized, and both are adhered respectively.

After that, as shown in FIG. 3C, sealing resin melted by heat is injected into an air gap portion surrounded by respective forming faces of the sealing dies 110 and 112 while being press-contacted, and a sealing resin layer 60 is formed.

At this time, the connection between the forming face of the sealing die 110 and the upper faces of the transparent layers 20 is firmly adhered by external force by sandwiched, and the connection between the light receiving element 10 and the transparent layer 20 is firmly adhered as described before. Then, if the coefficient of elasticity of the transparent layer 20 is equal to or more than 1 GPa and equal to or less than 6 GPa at 20° C., and equal to or more than 10 MPa and equal to or less than 3 GPa at 200° C., the transparent layer 20 itself is elastically deformed by sandwiched by the sealing die 110 so that the light receiving element 10 can be protected by absorbing the external force by sandwiched. Further, this elastic deformation can produce reaction force which makes the transparent layers 20 adhere to the sealing die 110. Consequently, the sealing resin cannot flow onto an adhesive face between the transparent layers 20 and the sealing die 110.

For the purpose of increasing adhering force between the transparent layers 20 and the sealing die 110 by the above mentioned elastic deformation of transparent layer 20, the height of the upper face of the transparent layer 20 may be between equal to or more than 0 mm and equal to or less than 0.06 mm from the height of the upper face of the sealing resin layer 60. In this case, when the upper face of the transparent layer 20 is designed to be 0.06 mm higher than the upper face of the sealing resin layer 60, the external force due to sandwiching of the sealing die 110 is increased, there is a case that deformation of the transparent layer 20 reaches plastic deformation and the transparent layer 20 is broken. On the other hand, in the case where the upper face of the transparent layer 20 is lower than the upper face of the sealing resin layer 60, that is, if the height of the upper face of the transparent layer 20 is less than the height of the upper face of the sealing resin layer 60 (less than 0 mm), it is obvious that the sealing resin flows onto a surface (adhesion face between the transparent layer 20 and the sealing die) of the transparent layer 20.

After that, the sealing dies 110 and 112 are removed, and the light receiving element 10 as shown in FIG. 2G can be obtained. In the light receiving element 10, the upper face of the transparent layer 20 is slightly protruded from the upper face of the sealing resin layer 60. As described above, the plurality of the light receiving elements 10 on the lead frame 40 are sealed in batch.

Next, effects of the present embodiment will be described. In the electronic device 80, the minimum area on the light receiving element 10, that is, only the optically functional region 12 is coated with the optically transparent layer 20, and the most part of the structure is coated with the sealing resin layer 60. The sealing resin layer 60 does not coat the optically functional region 12; and therefore, the sealing resin layer 60 is not required to be optically transparent. Consequently, reinforcement substances such as filler can be mixed with the sealing resin layer 60, and there can be obtained the following effects which could not achieved by the structure of the known electronic device using optically transparent sealing resin.

First, connection reliability is improved at a reflow step in the case of connecting to a mounting substrate while highly maintaining performance of light transmitting and receiving performance of the electronic device 80. The reinforcement substances such as the filler are mixed with the sealing resin layer 60 which coats the most part of the electronic device 80; and therefore, thermal expansion is small and thermal expansion of the sealing resin layer 60 at the reflow step can be suppressed as compared to the known optically transparent sealing resin. In addition, the optically functional region 12 is coated with the transparent layer 20; and therefore, the light transmitting and receiving performance of the electronic device 80 does not degrade. Furthermore, the transparent layer 20 is directly applied to the optically functional region 12; and therefore, the light transmitting and receiving performance of the electronic device 80 improves as compared to the case where adhesive is used.

In addition, adhesion supplement for improving adhesiveness with a wiring substrate such as the lead frame 40 can be mixed with resin serving as the sealing resin layer 60; and therefore, it is also possible to prevent moisture from entering into an interface between the substrate and the sealing resin layer. When the adhesion supplement is included, the known optically transparent sealing resin changes color by heat at the reflow step and optical transparency loses; and therefore, the adhesion supplement cannot be mixed. Furthermore, dimensional change of the electronic device 80 is suppressed even at rapid temperature rise of the reflow and the moisture can be prevented from entering into the electronic device, and therefore, a phreatic explosion in the electronic device can be suppressed. Therefore, the electronic device 80 having high connection reliability can be achieved in the case of mounting the electronic device 80.

In addition, the transparent layer 20 is formed by applying the film-shaped resin film 22 on the whole of the wafer; and therefore, a plurality of the transparent layer 20 can be formed in batch. Therefore, production efficiency improves as compared to the case where the transparent layer 20 is formed for each light receiving element 10. Furthermore, waste can be reduced.

Besides, the electronic device 80 has a structure in which the sealing resin layer 60 is applied only on one side for the wiring substrate such as the lead frame 40 or the like. If the known optically transparent sealing resin with which the reinforcement substances cannot be mixed exists on only one side, the substrate warps due to resin contraction. On the other hand, in the present embodiment, the sealing resin layer 60 includes the reinforcement substances such as the filler; and therefore, contraction of the sealing resin layer 60 can be suppressed. Therefore, even in the wiring substrate in which the sealing resin layer 60 is applied on a large area, its warp can be suppressed. Thus, a plurality of the light receiving elements 10 can be arranged on the lead frame 40. The electronic device 80 has a structure in which there is no lead protruding outside from the electronic device 80. Therefore, the electronic device 80 can be densely arranged by just no lead on the substrate, this dense portion can be arranged within warp suppression limit by the reinforcement substances, and the whole dense portion can be coated in batch with the sealing resin layer 60.

Further, the transparent layer 20 of the electronic device 80 is an elastic body having a coefficient of elasticity after hardening, of equal to or more than 1 GPa and equal to or less than 6 GPa at 20° C., and equal to or more than 10 MPa and equal to or less than 3 GPa at 200° C. Therefore, in the case of forming the sealing resin layer 60, even when the light receiving element 10 formed with the transparent layer 20 is directly sandwiched by the sealing dies 110 and 112, external force from the sealing die 110 is absorbed by elastic deformation of the transparent layer 20; and therefore, concentration of the external force exerted on one part of the light receiving element 10 is suppressed. Consequently, when the sealing resin layer 60 is formed, it is possible to prevent the light receiving element 10 from generating defects such as a crack. Therefore, in mounting the light receiving element, the electronic device 80 having high connection reliability is achieved. Further, the transparent layer 20 and the sealing die 110 are firmly adhered by reaction force of the elastic deformation, resin of the sealing resin layer 60 is not flown onto the upper face of the transparent layer 20; and therefore, the upper face of the transparent layer 20 is not contaminated.

Figure 4A:
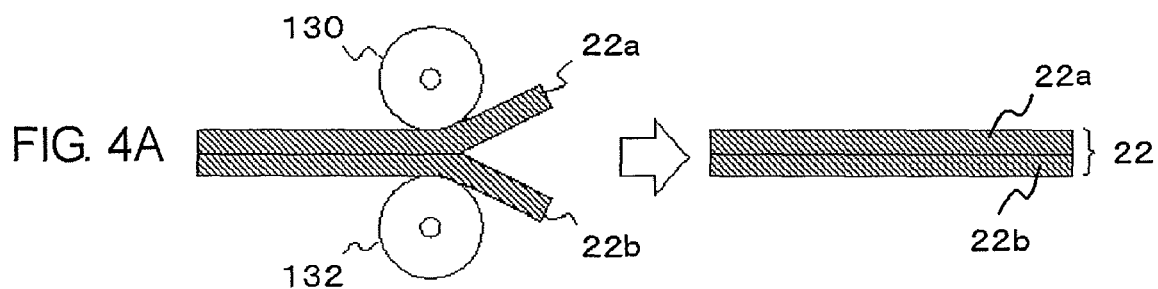
FIGS. 4A and 4B are cross-sectional views for explaining a process of manufacturing an electronic device in a second embodiment.
Figure 4B:
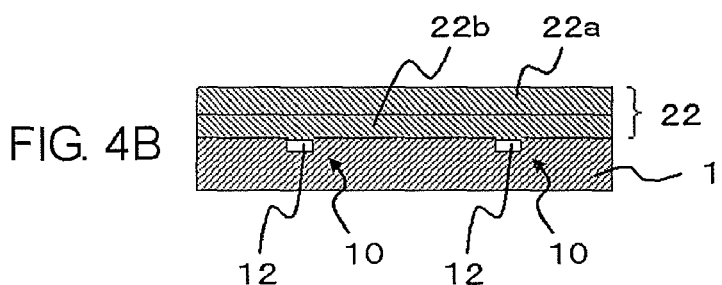

FIGS. 4A and 4B are cross-sectional views for explaining a process of manufacturing an electronic device in a second embodiment. A configuration of the electronic device in the second embodiment is the same as the first embodiment except for that a resin film 22 is formed by overlapping two resin films 22*a* and 22*b*. This increases a height of a transparent layer 20.

The resin film 22 in the present embodiment is formed by a manufacturing step as shown in FIGS. 4A and 4B. Other manufacturing steps are the same as the first embodiment; and therefore, their description will not be repeated. First, as shown in FIG. 4A, two film-shaped resin films 22*a* and 22*b* which are made of resin capable of hardening by light or heat are prepared. After that, the resin films 22*a* and 22*b* are overlapped by exerting pressure between rolls 130 and 132 with the roll laminator method. In this manner, the resin film 22 with almost neither deformation nor corrugation can be obtained. In addition, a film having a uniform thickness is used as the resin films 22*a* and 22*b*; and therefore, the resin film 22 in which the resin films 22*a* and 22*b* are overlapped has also a uniform thickness. Besides, an interface between applying faces of the resin films 22*a* and 22*b* is melted and joined by a heating process at a formation step; and therefore, it becomes the resin film 22 in which the interface disappears and there is no optical refraction and attenuation.

Incidentally, a step in which the resin film 22 is directly provided on the whole surface of the wafer 1 in the present embodiment is a step in which the resin film 22 is directly applied on the whole surface of the wafer 1. More specifically, the resin film 22 is formed on the wafer 1 by the vacuum laminator method. In doing so, an air bubble or the like is rarely generated on a contact face between the resin film 22 and the wafer 1.

In addition, solvent is used when the resin film is formed; however, this solvent needs to be removed when the film is formed. This removal of the solvent becomes difficult when the thickness of the film exceeds 0.08 mm. On the other hand, in the present embodiment, the resin film 22 is formed by overlapping two films each having a thickness equal to or less than 0.08 mm; and therefore, it is possible to remove the solvent in a film state. Therefore, even the film thickness of the resin film 22 increases, it is possible to prevent the solvent from remaining.

The transparent layer 20 formed by overlapping the resin films 22*a* and 22*b* becomes high; and therefore, a separation distance between a top of the thin metallic wire 50 and the sealing die 110 becomes large and it is possible to sufficiently prevent the thin metallic wire 50 and the sealing die 110 from coming into contact with each other. In addition, it is possible to enhance a degree of freedom in design of height of the sealing resin layer 60 and the transparent layer 20 by increasing the height of the transparent layer 20.

In addition, the present embodiment can also obtain the same effects as in the first embodiment. Besides, as described in the first embodiment, the height of the transparent layer 20 can be designed to be higher than that of the sealing resin layer 60 by up to 0.06 mm. Further, if the height of the upper face of the transparent layer 20 increases from the upper face of the sealing resin layer 60, elastic deformation of the transparent layer 20 increases; and by this reaction force, the transparent layer 20 and the sealing die 110 can be firmly adhered. In this case, it is possible to further prevent the sealing resin layer 60 from entering to the upper face of the transparent layer 20. Furthermore, it becomes possible to ensure the thickness of the sealing resin layer 60 by increasing the height of the transparent layer 20, and to increase the height from the upper face of the sealing resin layer 60 to the upper face of the transparent layer 20 by up to 0.06 mm while protecting the light receiving element 10 and the thin metallic wire 50 by the sealing resin without exposure.

In addition, the resin films 22*a* and 22*b* are overlapped before forming the resin film 22 on the wafer 1; and therefore, it is possible to reduce generating of deformation and corrugation in the resin film 22. On the other hand, if it is tried to apply the resin films 22*a* and 22*b* on the wafer 1 in order, when the second resin film 22*b* is further applied after applying the resin film 22*a* on the wafer 1, deformation and corrugation are generated in the resin film 22 that is a laminated body of the resin films 22*a* and 22*b* due to adherence of the resin films 22*a* and 22*b*.

Besides, the roll laminator method can be used for overlapping the resin films 22*a* and 22*b*. A press-contact portion of the resin films 22*a* and 22*b* is limited to a local area in the resin film 22 by the roll laminator method; and even when there is adherence in the resin films 22*a* and 22*b*, deformation and corrugation escape to a non press-contact portion. As a result, it is possible to overlap the resin films 22*a* and 22*b* in a state where there is almost neither deformation nor corrugation.

In addition, the vacuum laminator method can be used as a method of forming the resin film 22 on the wafer 1. That is, an air bubble between the wafer 1 and the resin film 22 is easily pulled by the vacuum laminator method, pressure can be uniformly exerted on the whole of the thin wafer 1, and a crack of the wafer 1 can be prevented.

FIGS. 5A to 5C are cross-sectional views each showing a method of manufacturing an electronic device in a third embodiment, and views corresponding to FIGS. 3A to 3C of the first embodiment. The method of manufacturing the electronic device according to the present embodiment is the same as the methods of manufacturing the electronic devices described in the first and the second embodiments except for details of a step of forming a sealing resin layer 60.

The step of forming the sealing resin layer 60 in the present embodiment is as follows: first, as shown in FIG. 5A, light receiving elements 10 and a lead frame 40 are arranged between sealing dies 110 and 112, and a shock-absorbing member 70 is arranged between the lead frame 40 and the sealing die 112. The shock-absorbing member 70 is a film shaped member and has flexibility. As the shock-absorbing member 70, for example, a resin film having flexibility can be used.

Next, as shown in FIG. 5B, the light receiving elements 10, the lead frame 40, and the shock-absorbing member 70 are sandwiched by the sealing dies 110 and 112.

After that, as shown in FIG. 5C, a sealing resin layer 60 is formed by injecting resin into a space between the sealing dies 110 and 112 in a state of FIG. 5B.

The same effects as the first and the second embodiments can also be obtained by the present embodiment. In addition, when the light receiving elements 10 and the lead frame 40 are sandwiched by the sealing dies 110 and 112, the shock-absorbing member 70 is arranged under the lead frame 40; and therefore, it is possible to prevent the light receiving elements 10 from braking due to pressure of the sealing dies 110 and 112.

As described above, embodiments of the present invention are described with reference to the drawings; however, these are exemplification of the present invention and various configurations other than the above mentioned can be adopted.

It is apparent that the present invention is not limited to the above embodiments, and may be modified and changed without departing from the scope and spirit of the invention.

What is claimed is:

1. An electronic device, comprising:
   an element which has an optically functional region having an optical function on one face;
   a transparent layer which is located on said optically functional region, directly comes in contact with the one face, and is optically transparent and a resin layer; and
   a sealing resin layer having an upper face and a lower face which seals said one face and sides of said transparent layer, does not coat an upper face of said transparent layer, and is mixed with filler that improves rigidity;
   wherein the upper face of said transparent layer and an upper face of said sealing resin layer are exposed on a surface of said electronic device, and
   wherein the upper face of said transparent layer is 10 μm to 60 μm above the upper face of said sealing resin layer.

2. The electronic device according to claim 1, wherein said transparent layer includes acrylic group resin or epoxy group resin.

3. The electronic device according to claim 1, wherein said transparent layer is film-shaped resin.

4. The electronic device according to claim 1, wherein said transparent layer has a coefficient of elasticity which is equal to or more than 1 GPa and equal to or less than 6 GPa at 20° C., and equal to or more than 10 MPa and equal to or less than 3 GPa at 200° C.

5. The electronic device according to claim 1, wherein said transparent layer has a height equal to or more than 0.05 mm.

\* \* \* \* \*

UNITED STATES PATENT AND TRADEMARK OFFICE
CERTIFICATE OF CORRECTION

PATENT NO. : 8,252,408 B2
APPLICATION NO. : 12/437940
DATED : August 28, 2012
INVENTOR(S) : Kenji Uchida and Koki Hirasawa It is certified that error appears in the above-identified patent and that said Letters Patent is hereby corrected as shown below:

On the Title Page

Left column, after Item (65), please insert the following.

Item --(30) Foreign Application Priority Data

June 12, 2008   (JP).........2008-153783--

Signed and Sealed this
Sixteenth Day of October, 2012

David J. Kappos
*Director of the United States Patent and Trademark Office*